(12) United States Patent
Kato

(10) Patent No.: US 12,183,706 B2
(45) Date of Patent: Dec. 31, 2024

(54) IC MODULE AND METHOD OF MANUFACTURING IC MODULE

(71) Applicant: Murata Manufacturing Co., Ltd., Nagaokakyo (JP)

(72) Inventor: Noboru Kato, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 267 days.

(21) Appl. No.: 17/656,499

(22) Filed: Mar. 25, 2022

(65) Prior Publication Data
US 2022/0216174 A1 Jul. 7, 2022

Related U.S. Application Data

(63) Continuation of application No. PCT/JP2020/036706, filed on Sep. 28, 2020.

(30) Foreign Application Priority Data
Feb. 27, 2020 (JP) .................................. 2020-031163

(51) Int. Cl.
*H01L 23/00* (2006.01)
(52) U.S. Cl.
CPC ............. *H01L 24/32* (2013.01); *H01L 24/16* (2013.01); *H01L 24/73* (2013.01); *H01L 24/81* (2013.01);
(Continued)
(58) Field of Classification Search
CPC ......... H01L 24/32; H01L 24/16; H01L 24/73; H01L 24/81; H01L 24/83;
(Continued)

(56) References Cited

U.S. PATENT DOCUMENTS 6,409,866 B1 6/2002 Yamada
7,208,832 B2 * 4/2007 Yamagata ............... H01L 24/82
257/E23.179
(Continued)

FOREIGN PATENT DOCUMENTS

JP H08307045 A 11/1996
JP 2000340614 A 12/2000
(Continued)

OTHER PUBLICATIONS

International Search Report issued for PCT/JP2020/036706, date of mailing Dec. 1, 2020.
(Continued)

*Primary Examiner* — Douglas W Owens
(74) *Attorney, Agent, or Firm* — ArentFox Schiff LLP

(57) ABSTRACT

An IC module is provided that includes an IC having a terminal electrode, and a substrate having a first surface and a second surface opposite to each other and having a land formed on the first surface. Moreover, the land is connected to the terminal electrode of the IC. On the first surface of the substrate, an insulator layer that covers an area outside of a formation area of the land is formed. A difference between a thickness of the insulator layer and a thickness of the IC is smaller than a difference between the thickness of the insulator layer and a thickness of the substrate, and the thickness of the substrate is smaller than the thickness of the insulator layer.

6 Claims, 12 Drawing Sheets

(52) U.S. Cl.
CPC .... *H01L 24/83* (2013.01); *H01L 2224/16227* (2013.01); *H01L 2224/32225* (2013.01); *H01L 2224/73204* (2013.01); *H01L 2224/81203* (2013.01); *H01L 2224/83203* (2013.01); *H01L 2924/3512* (2013.01)

(58) Field of Classification Search
CPC . H01L 2224/16227; H01L 2224/32225; H01L 2224/73204; H01L 2224/81203; H01L 2224/83203; H01L 2924/3512; H01L 24/11; H01L 24/13; H01L 24/29; H01L 2224/11312; H01L 2224/1132; H01L 2224/11849; H01L 2224/131; H01L 2224/13294; H01L 2224/133; H01L 2224/81024; H01L 2224/81192; H01L 2224/81815; H01L 2224/83007; H01L 2224/83192; H01L 2224/83886; H01L 23/12; H05K 3/32; H05K 3/34
See application file for complete search history.

(56) References Cited

U.S. PATENT DOCUMENTS

| 10,957,984 | B2 | 3/2021 | Kato | |
|---|---|---|---|---|
| 2011/0095418 | A1* | 4/2011 | Lim | H01L 24/14 |
| | | | | 257/737 |
| 2013/0089952 | A1* | 4/2013 | Lu | H01L 23/562 |
| | | | | 211/41.18 |
| 2017/0083804 | A1 | 3/2017 | Kato et al. | |
| 2019/0081402 | A1 | 3/2019 | Kato | |

FOREIGN PATENT DOCUMENTS

| JP | 2017153009 A | 8/2017 |
|---|---|---|
| WO | 2016084658 A1 | 6/2016 |
| WO | 2018194173 A1 | 10/2018 |

OTHER PUBLICATIONS

Written Opinion of the International Searching Authority issued for PCT/JP2020/036706, date of mailing Dec. 1, 2020.

* cited by examiner

IC MODULE AND METHOD OF MANUFACTURING IC MODULE

CROSS REFERENCE TO RELATED APPLICATIONS

The present application is a continuation of PCT/JP2020/036706 filed Sep. 28, 2020, which claims priority to Japanese Patent Application No. 2020-031163, filed Feb. 27, 2020, the entire contents of each of which are incorporated herein by reference.

TECHNICAL FIELD

The present invention relates to an IC module including a substrate and an IC chip mounted on the substrate, and a method of manufacturing the IC module.

BACKGROUND

Currently, an IC module having a predetermined function by a predetermined circuit and an IC chip mounted on a substrate on which the circuit is configured is used for various electronic components and electronic devices. For example, for a radio frequency identifier (RFID) tag attached to an article, an RFIC module including an RFIC and an impedance matching circuit is used.

WO 2016/084658 A (hereinafter "Patent Literature 1") discloses an RFID tag including a conductor acting as an antenna and an RFIC module coupled to the conductor.

Such an RFIC module is required to be thin as a whole, to have a flat surface, to structurally protect the mounted RFIC, and the like for convenience of bonding to an article. For reducing the thickness, it is effective to use a thin substrate. Further, for flattening and protection of the RFIC, it is effective to attach a cover film to the surface of the substrate on which the IC chip is mounted.

Although it is effective to use a thin substrate for reducing the thickness, when the substrate is thinned, it is difficult to handle the substrate, and it is also difficult to mount the IC on the substrate. Further, in the structure in which the cover lay film is provided, since the thickness of the cover lay film and an adhesive layer for bonding the cover lay film is large, it is not suitable for reducing the entire thickness.

The above circumstances are common not only to the RFIC module for the RFID tag, but also to a small and thin IC module having various functions.

SUMMARY OF THE INVENTION

Accordingly, it is an object of the present invention to provide an IC module in which an IC is protected by a structure around a mounting position of the IC. As such, the entire IC module can be thinned.

In an exemplary aspect, an IC module is provided that includes an IC having a terminal electrode, and a substrate having a first surface and a second surface opposite to each other and having a land that is formed on the first surface and is connected to the terminal electrode of the IC. Further, an insulator layer covering an area outside of a formation area of the land on the first surface of the substrate is provided, and a difference between a thickness of the insulator layer and a thickness of the IC is smaller than a difference between the thickness of the insulator layer and a thickness of the substrate. Yet further, the thickness of the substrate is smaller than the thickness of the insulator layer.

In another exemplary aspect, a method of manufacturing an IC module is provided in which the IC module includes an IC having a terminal electrode, a substrate having a first surface and a second surface opposite to each other and having a land that is formed on the first surface and is connected to the terminal electrode of the IC, and an insulator layer covering an area outside of a formation area of the land on the first surface of the substrate. Further, the exemplary manufacturing method includes an insulator sheet processing process of forming an opening at a position facing the land with respect to an insulator sheet that is made of a material of the insulator layer and has a thickness smaller than a thickness of the IC, and has a relationship in which a difference between the thickness of the insulator sheet and the thickness of the IC is smaller than a difference between the thickness of the insulator sheet and a thickness of the substrate. In this aspect, an insulator layer forming process of forming the insulator layer of the insulator sheet is performed by bonding the insulator sheet to the first surface of the substrate having a thickness smaller than that of the insulator layer; an anisotropic conductive paste forming process of forming an anisotropic conductive paste to be electrically connected is performed by pressurization and heating in the opening of the insulator layer; and a pressurizing and heating process of pressurizing and heating the IC with respect to the substrate is performed after the anisotropic conductive paste forming process.

By forming the substrate as a collective substrate in which a plurality of the IC modules are arranged longitudinally and laterally, and processing the substrate in this collective substrate state, productivity is improved.

Furthermore, in another exemplary aspect, a method of manufacturing an IC module is provided for forming an IC module that includes an IC having a terminal electrode, a substrate having a first surface and a second surface opposite to each other and having a land that is formed on the first surface and is connected to the terminal electrode of the IC, and an insulator layer that covers an area outside of a formation area of the land on the first surface of the substrate. Further, the manufacturing method includes: an insulator sheet processing process of forming an opening at a position facing the land with respect to an insulator sheet made of a material of the insulator layer; an insulator layer forming process of forming the insulator layer of the insulator sheet by bonding the insulator sheet to the first surface of the substrate having a thickness smaller than that of the insulator layer; a solder paste printing process of printing a solder paste in the opening of the insulator layer; a first reflow process of, after the solder paste printing process, turning the land into a land with solder by reflow soldering the substrate on which the insulator layer is formed; an IC mounting process of applying a flux to the terminal electrode of the IC and mounting the IC on the land with solder; and a second reflow process of soldering the IC to the land by reflow soldering the substrate on which the IC is mounted.

By forming the substrate as a collective substrate in which a plurality of the IC modules are arranged longitudinally and laterally, and processing the substrate in this collective substrate state, productivity is improved.

According to the structure described above, and according to the manufacturing method, although the entire IC module is thinned by using a thin substrate, moderate flexibility (e.g., hardness) is maintained by the insulator layer, the IC module is flattened by the insulator layer, and the IC of the IC module is protected by the insulator layer. Therefore, an increase in thickness due to the provision of the cover lay film is avoided.

According to the exemplary aspects of the present invention, an IC module is provided in which an IC is protected by a structure around a mounting position of the IC and the entire IC module is thinned.

DESCRIPTION OF EMBODIMENTS

First Exemplary Embodiment

Figure 1:
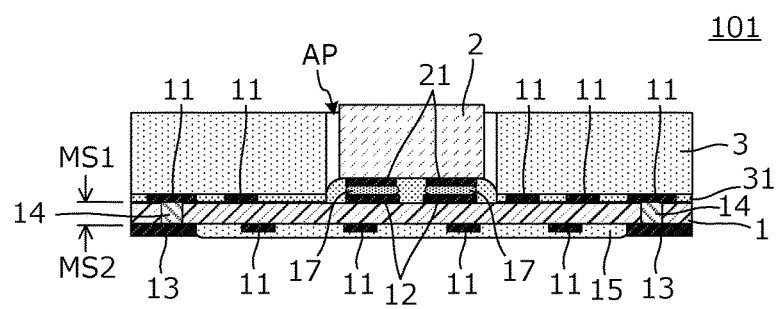
FIG. 1 is a cross-sectional view of an IC module 101 according to a first exemplary embodiment.
Figure 2:
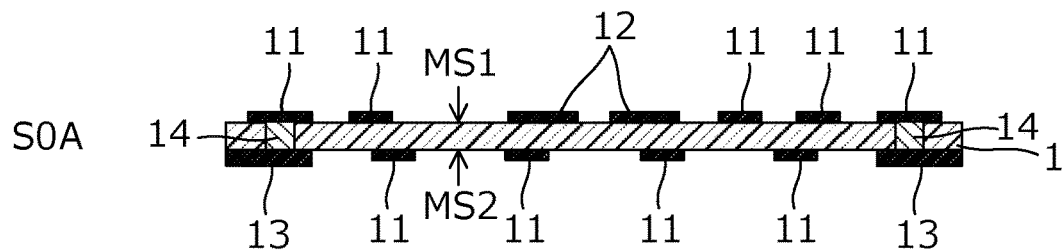
FIG. 2 is a diagram illustrating a cross-sectional structure of the IC module in each process at a time of manufacturing the IC module 101.
Figure 2:
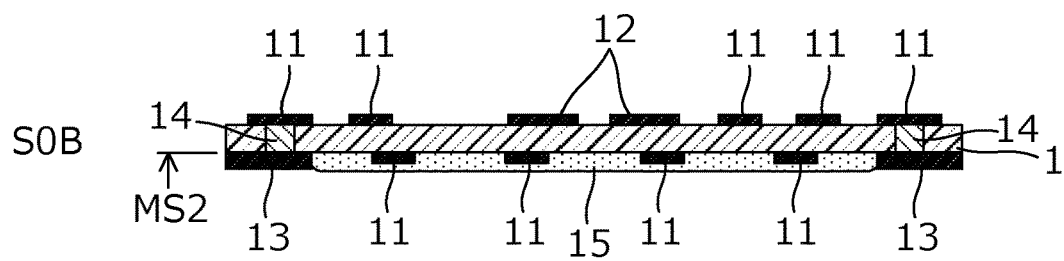
Figure 2:
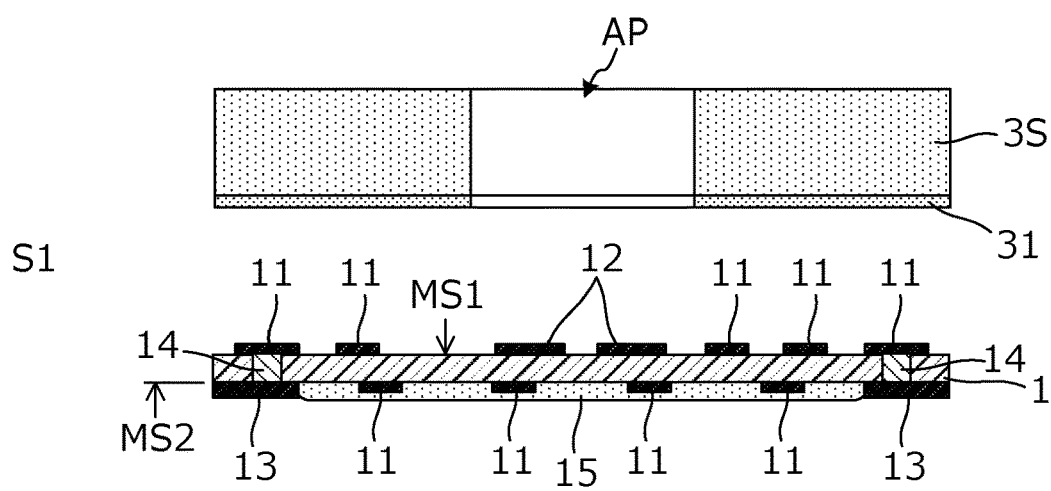
Figure 2:
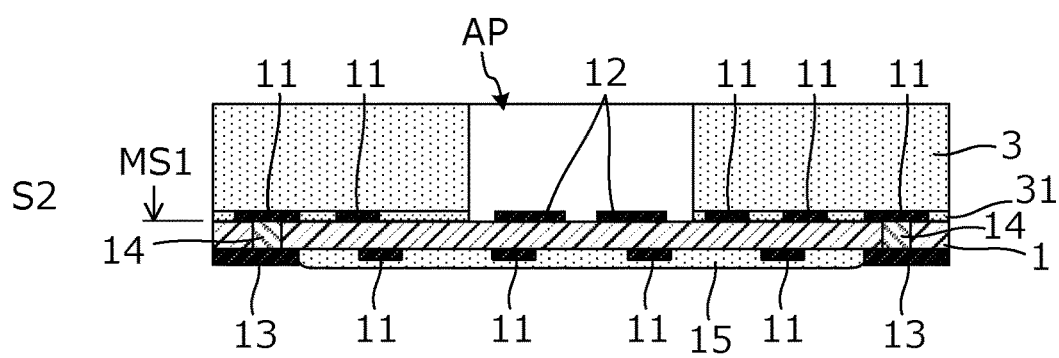
Figure 3:
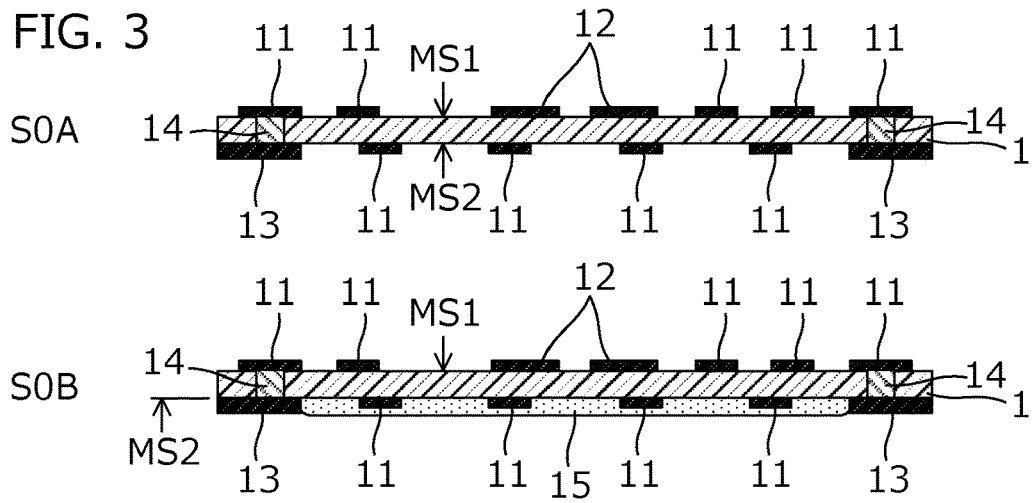
FIG. 3 is an alternative example to the processes illustrated in FIG. 2.
Figure 3:
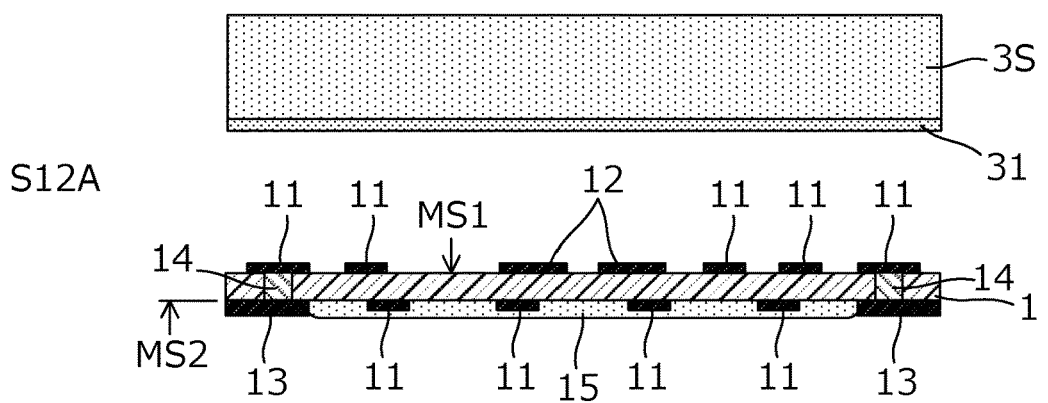
Figure 3:
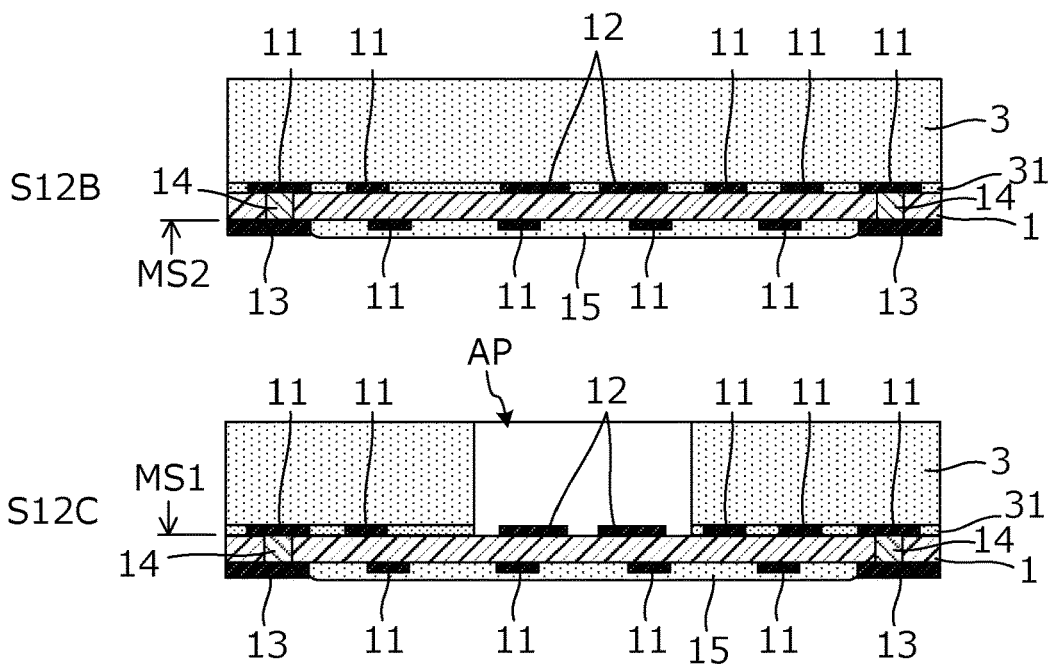
Figure 4:
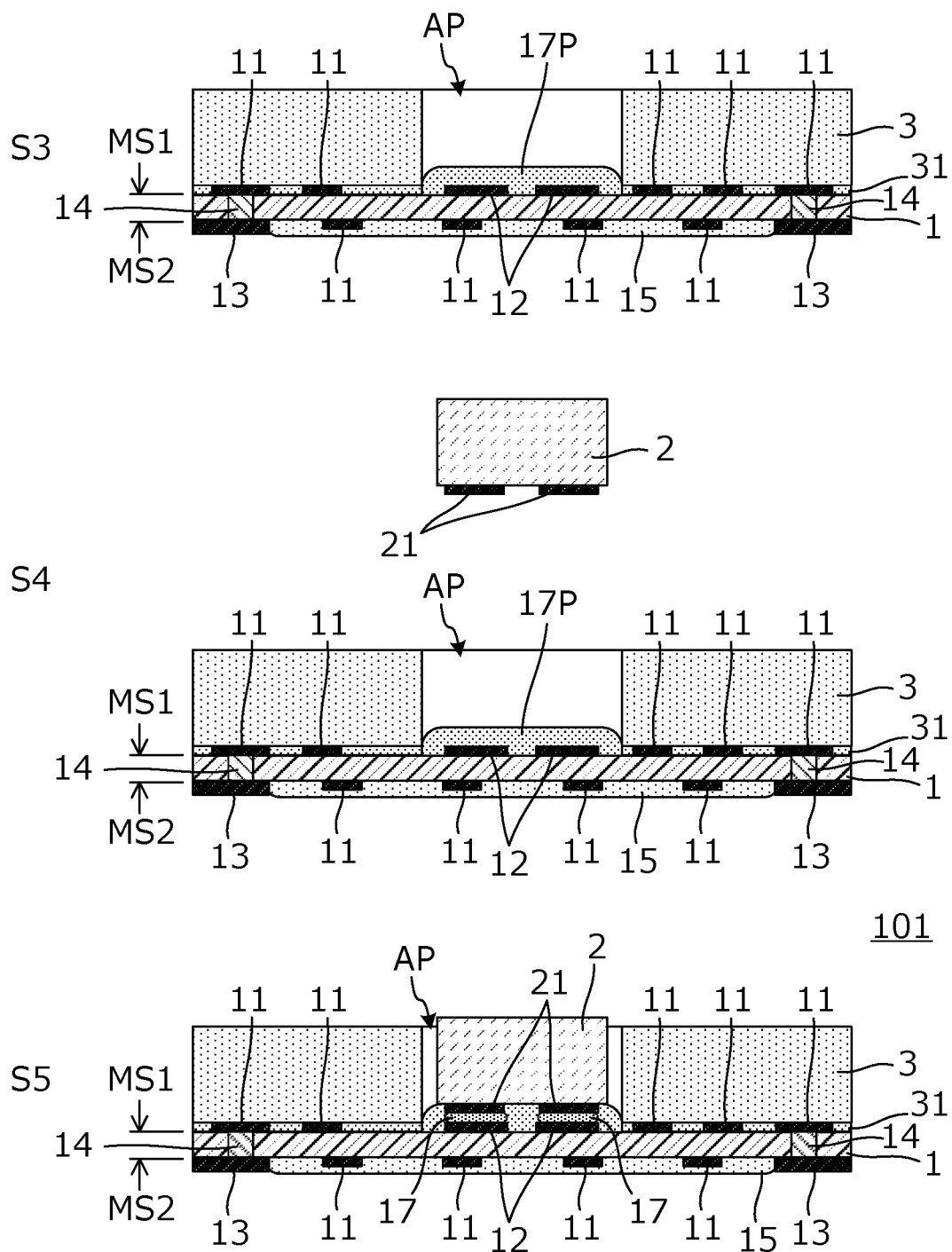
FIG. 4 is a diagram illustrating a cross-sectional structure of the IC module in each process at the time of manufacturing the IC module 101.

FIG. 1 is a cross-sectional view of an IC module 101 according to a first exemplary embodiment. FIGS. 2, 3, and 4 are diagrams illustrating a cross-sectional structure of the IC module in each process at the time of manufacturing the IC module 101. FIG. is a flowchart illustrating a procedure of a method of manufacturing the IC module 101. It is noted that FIG. 3 is an alternative example of the processes illustrated in FIG. 2. In practice, a large number of IC modules are manufactured by collective processing on a collective substrate and divided at the end to obtain individual IC modules, but FIGS. 2, 3, and 4 illustrate a single IC module portion for convenience of description.

As illustrated in FIG. 1, an IC module 101 of the present embodiment includes an IC 2, a substrate 1, and an insulator layer 3. The IC 2 is a chip divided from a wafer, and includes terminal electrodes 21 on a lower surface. The substrate 1 includes a first surface MS1 and a second surface MS2 opposite to each other. Lands 12 to which the terminal electrodes 21 of the IC 2 are connected are formed on the first surface MS1. Input/output terminals 13 of the IC module 101 are formed on the second surface MS2 of the substrate 1. Further, conductor patterns 11 are formed on the first surface MS1 and the second surface MS2 of the substrate 1. In an exemplary aspect, each of the conductor patterns 11 has, for example, a coil shape, thereby forming an inductor. Interlayer connection conductors 14 for electrically connecting the conductor patterns 11 and the input/output terminals 13 are formed inside the substrate 1. The substrate 1 is, for example, a flexible substrate using polyimide as a base material, and the conductor patterns 11, the lands 12, the input/output terminals 13, the interlayer connection conductors 14, and the like are formed of copper.

As further shown, the insulator layer 3 covers an area outside of a formation area of the lands 12 on the first surface MS1 of the substrate 1. The insulator layer 3 is bonded to the first surface MS1 of the substrate 1 via an adhesive layer 31. An opening AP is formed in the insulator layer 3, and the opening AP acts as a cavity for housing the IC2. The insulator layer 3 is, for example, a polyimide sheet. The terminal electrodes 21 of the IC 2 are connected to the lands 12 of the substrate 1 via an anisotropic conductor layers 17.

The thickness of the substrate 1 is, for example, 6 μm, the thickness of the insulator layer 3 is, for example, 100 μm, and the thickness of the IC 2 is, for example, 100 μm. Therefore, in this example, a difference between the thickness of the insulator layer 3 and the thickness of the IC 2 is 0, a difference between the thickness of the insulator layer 3 and the thickness of the substrate 1 is 94 μm, and the difference between the thickness of the insulator layer 3 and the thickness of the IC 2 is smaller than the difference between the thickness of the insulator layer 3 and the thickness of the substrate 1. Further, the thickness of the substrate 1 is thinner than the thickness of the insulator layer 3. That is, the insulator layer 3 and the IC 2 are thicker than the substrate 1 in the same degree according to the exemplary aspect.

Figure 5:
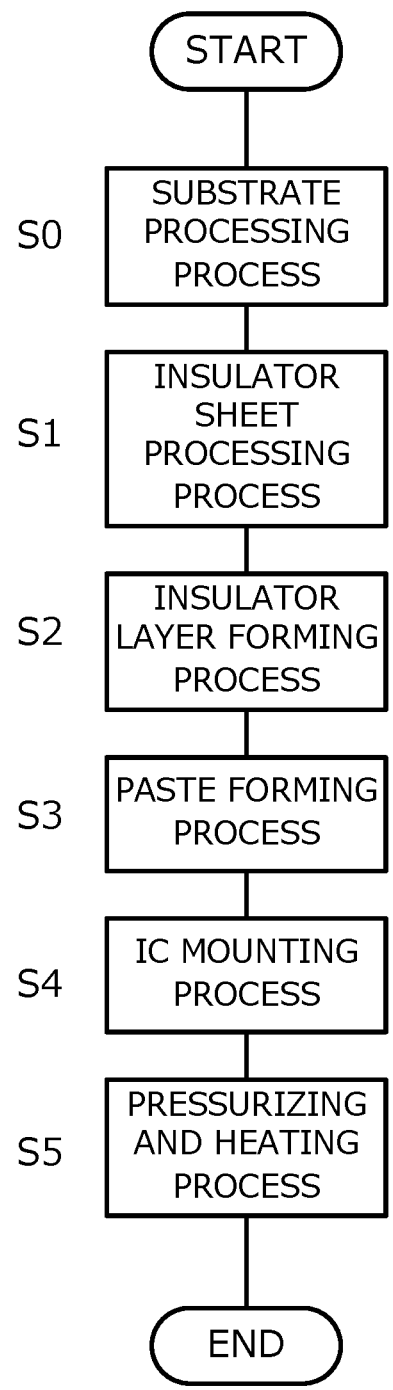
FIG. 5 is a flowchart illustrating a procedure of a method of manufacturing the IC module 101.

A method of manufacturing the IC module 101 of the present embodiment is as follows. Steps S0A and S0B in FIG. 2 correspond to a substrate processing process S0 in FIG. 5, step S1 in FIG. 2 corresponds to an insulator sheet processing process S1 in FIG. 5, and step S2 in FIG. 2 corresponds to an insulator layer forming process S2 in FIG. 5. Further, step S3 in FIG. 4 corresponds to a paste forming process S3 in FIG. 5, step S4 in FIG. 4 corresponds to an IC mounting process S4 in FIG. 5, and step S5 in FIG. 4 corresponds to a pressurizing and heating process S5 in FIG. 5.

First, as illustrated in step S0A of FIG. 2, the conductor patterns 11, the lands 12, and the like are formed on the first surface MS1 of the substrate 1, and the conductor patterns 11, the input/output terminals 13, and the like are formed on the second surface MS2. Further, the interlayer connection conductors 14 are formed inside the substrate 1.

Next, as illustrated in step S0B, a resist film 15 is formed on the second surface MS2 of the substrate 1, and only the input/output terminals 13 are exposed.

Next, as illustrated in step S1, an opening AP is formed at a predetermined position of an insulator sheet 3S (e.g., a position facing the lands 12 formed on the substrate 1), and the adhesive layer 31 is applied to a lower surface.

Next, by bonding the insulator sheet 3S to the first surface MS1 of the substrate 1, as illustrated in step S2, the insulator layer 3 of the insulator sheet 3S is formed on the first surface MS1 of the substrate 1. By forming the insulator layer 3 thicker than the substrate 1 in this manner, the substrate 1 with the insulator layer 3 has an appropriate thickness and appropriate flexibility (e.g., hardness). This configuration makes it easy to handle the substrate 1 with the insulator layer 3 hereinafter.

It is noted that in the example illustrated in FIG. 2, the resist film 15 is formed on the second surface MS2 of the substrate 1 before the insulator sheet 3S is bonded, but the resist film 15 may be formed after the insulator layer 3 is formed on the substrate 1 in an alternative aspect.

Thereafter, as illustrated in step S3 of FIG. 4, an anisotropic conductive paste (ACP) 17P is applied into the opening AP of the insulator layer 3 to form the anisotropic conductive paste 17P on the first surface MS1 of the substrate 1. This "application" is performed by, for example, a dispenser.

Next, in step S4, the IC 2 is placed in the opening AP. Thereafter, in step S5, the IC 2 is pressurized and heated to form the anisotropic conductor layers 17 between the lands 12 of the substrate 1 and the terminal electrodes 21 of the IC 2 out of the anisotropic conductive paste 17P. As a result, the terminal electrodes 21 of the IC 2 are connected to the lands 12 of the substrate 1. Thereafter, the uncured anisotropic conductive paste 17P is removed by washing as necessary. Thus, the IC module 101 is configured according to the exemplary method described herein.

When the substrate 1 is a collective substrate on which a plurality of the IC modules 101 are arranged longitudinally and laterally, the IC modules 101 in a state of the collective substrate include a collective substrate on which the plurality of lands 12 to which a plurality of the ICs 2 are connected are formed, and the insulator layer 3 covering an area outside a formation area of the plurality of lands 12 of the collective substrate. In the anisotropic conductive paste forming process, the anisotropic conductive paste 17P is applied to each of the lands 12 of the collective substrate. In the pressurizing and heating process, the plurality of ICs 2 having the terminal electrodes 21 are mounted on the collective substrate, and the plurality of ICs 2 are pressurized and heated at a time by a pressurizing plate with respect to the collective substrate on which the ICs 2 are mounted. As a result, the IC modules 101 in the state of the collective substrate in which the plurality of ICs 2 are electrically joined to the collective substrate via the anisotropic conductor layers 17 is manufactured. Thereafter, the IC modules are divided into an individual IC module 101 in this exemplary aspect.

As described above, when the plurality of ICs 2 are pressurized at a time, a state of pressurization applied to the ICs 2 varies due to the inclination of the pressurizing plate, an application amount of the anisotropic conductive paste 17P, the inclination at the time of mounting the ICs 2, and the like, and a problem that the ICs 2 are broken or cracked easily occurs. However, by bringing the thickness of the insulator layer 3 close to the thickness of each of the ICs 2, when the pressurizing plate applies pressure in a certain value or more, the pressurizing plate abuts on the insulator layer 3. Therefore, the insulator layer 3 acts as a stopper for the pressurizing plate, and breakage and cracking of the ICs 2 can be prevented in advance.

In the example described above, the insulator layer forming process (S2) is performed after the insulator sheet processing process (S1), but this process order may be reversed in an alternative aspect. FIG. 3 is a diagram illustrating a part of a manufacturing process of the IC module in that case.

First, as illustrated in step S0A of FIG. 3, the conductor patterns 11, the lands 12, and the like are formed on the first surface MS1 of the substrate 1, and the conductor patterns 11, the input/output terminals 13, and the like are formed on the second surface MS2. Further, the interlayer connection conductors 14 are formed inside the substrate 1.

Next, as illustrated in step S0B, a resist film 15 is formed on the second surface MS2 of the substrate 1, and only the input/output terminals 13 are exposed.

Next, as illustrated in step S12A, the adhesive layer 31 is applied to the lower surface of the insulator sheet 3S, and as illustrated in step S12B, the insulator sheet 3S is bonded to the first surface MS1 of the substrate 1, thereby forming the insulator layer 3 of the insulator sheet 3S on the first surface MS1 of the substrate 1.

Thereafter, as illustrated in step S12C of FIG. 3, a predetermined position of the insulator layer 3 (e.g., a position facing the lands 12 formed on the substrate 1) is etched to form the opening AP.

It is noted that in the example illustrated in FIG. 1, an upper surface height of the insulator layer 3 is lower than an upper surface height of the IC 2. However, the upper surface of the IC 2 and the upper surface of the insulator layer 3 can be flush or substantially flush after pressurization and heating according to an exemplary aspect.

As described above, according to the present embodiment, despite the IC 2 mounted in the opening AP of the insulator layer 3, the IC 2 can be mounted in the opening AP of the insulator layer 3 via the anisotropic conductor layers 17. Then, since the insulator layer 3 is formed around the IC 2 along the first surface MS1 of the substrate 1, the surface of the IC module 101 is flattened, and the IC 2 is protected by the insulator layer 3. Further, since it is not necessary to cover the substrate 1 with the cover lay film, the entire IC module 101 can be made thinner.

Second Exemplary Embodiment

In the second embodiment, an IC module in which an IC is soldered in an opening of an insulator layer will be described.

Figure 6:
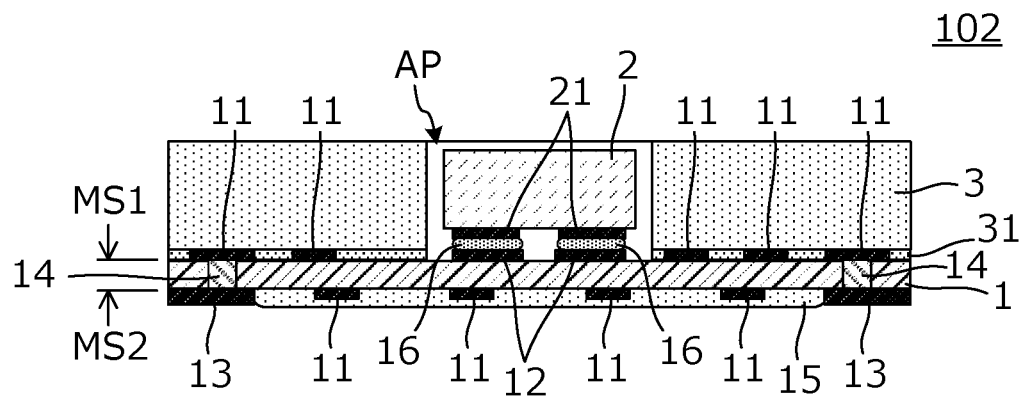
FIG. 6 is a cross-sectional view of an IC module 102 according to a second exemplary embodiment.
Figure 7:
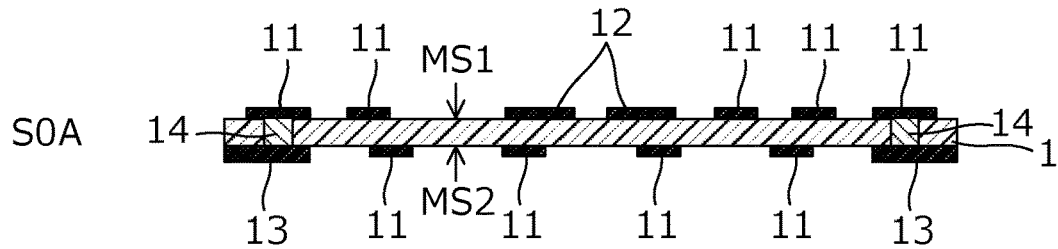
FIG. 7 is a diagram illustrating a cross-sectional structure of the IC module in each process at the time of manufacturing the IC module 102.
Figure 7:
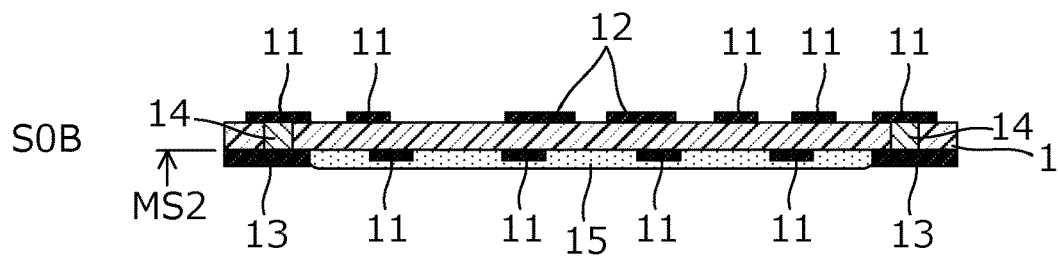
Figure 7:
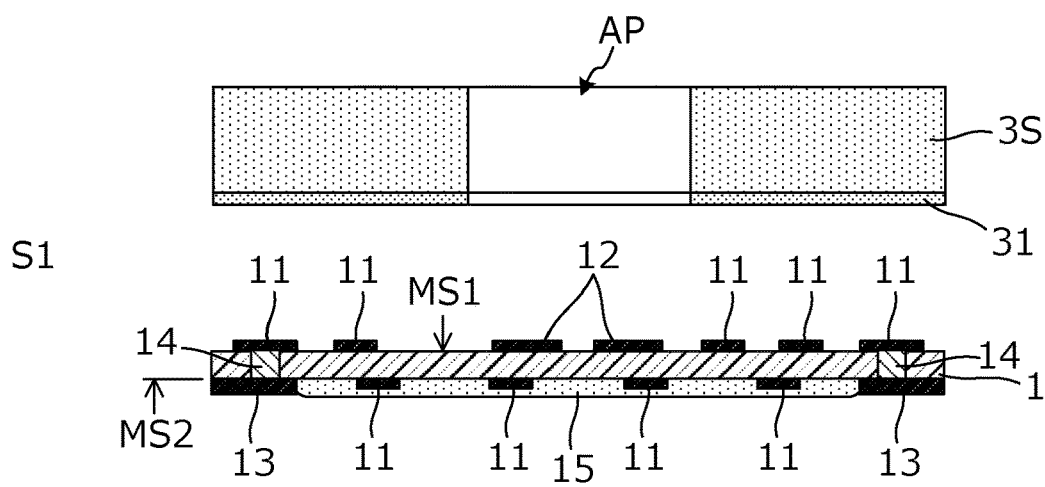
Figure 7:
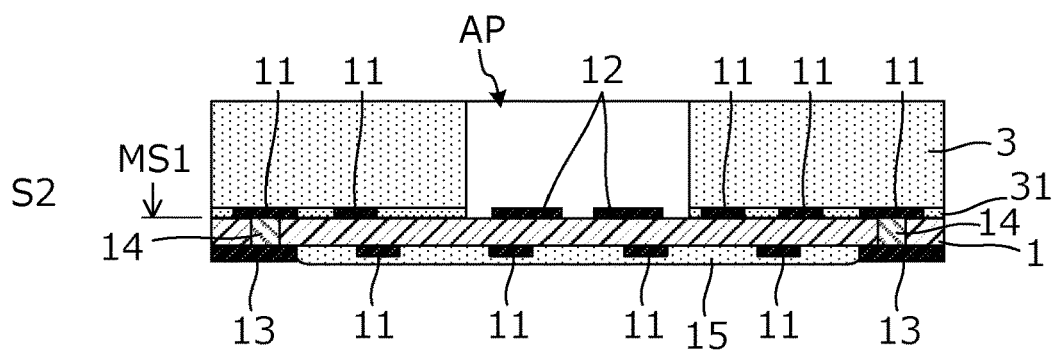
Figure 8:
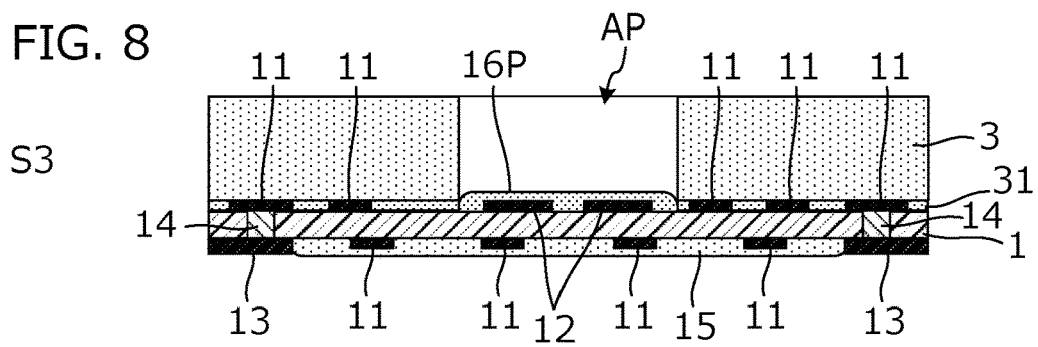
FIG. 8 is a diagram illustrating a cross-sectional structure of the IC module in each process at the time of manufacturing the IC module 102.
Figure 8:
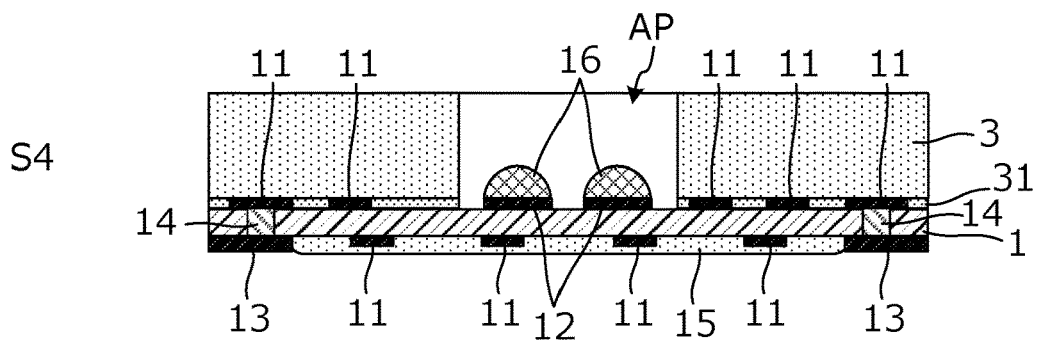
Figure 8:
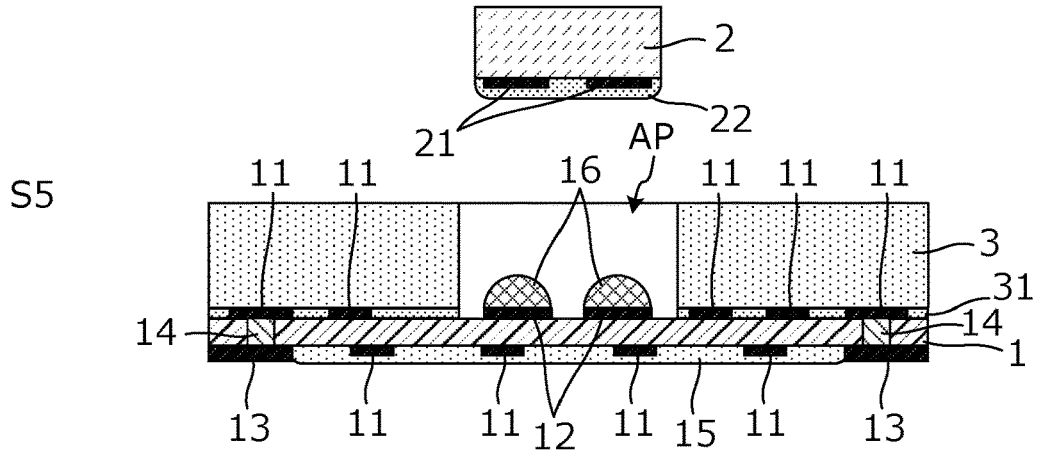
Figure 8:
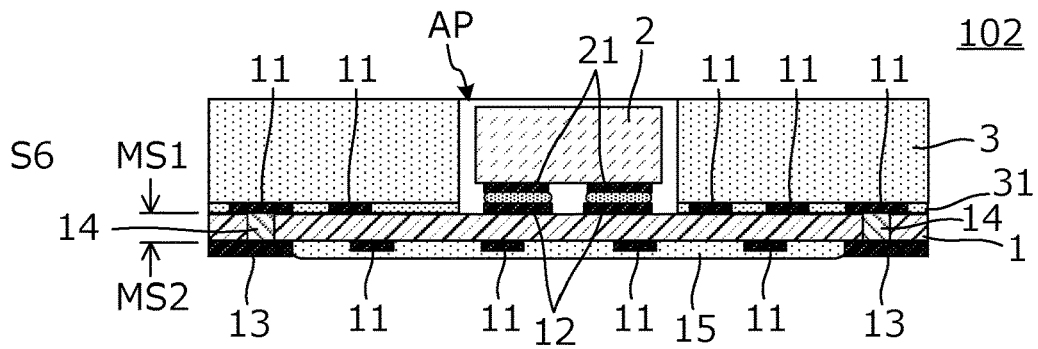

FIG. 6 is a cross-sectional view of an IC module 102 according to a second exemplary embodiment. FIGS. 7 and 8 are diagrams illustrating a cross-sectional structure of the IC module 102 in each process at the time of manufacturing the IC module. In practice, a large number of IC modules are manufactured by collective processing and finally divided to obtain individual IC modules, but FIGS. 7 and 8 illustrate a single IC module portion to facilitate the description.

As illustrated in FIG. 6, the IC module 102 of the present embodiment includes the IC 2, the substrate 1, and the insulator layer 3. Differing from the exemplary aspect illustrated in FIG. 1, in the second embodiment, the terminal electrodes 21 of the IC 2 are connected to the lands 12 of the substrate 1 via solders 16. Other configurations are similar to those of the IC module 101 described in the first embodiment and will not be repeated herein.

A method of manufacturing the IC module 102 of the present embodiment is as follows.

First, as illustrated in step S0A of FIG. 7, the conductor patterns 11, the lands 12, and the like are formed on the first surface MS1 of the substrate 1, and the conductor patterns 11, the input/output terminals 13, and the like are formed on the second surface MS2. Further, the interlayer connection conductors 14 are formed inside the substrate 1.

Next, as illustrated in step S0B, a resist film 15 is formed on the second surface MS2 of the substrate 1, and only the input/output terminals 13 are exposed.

Next, as illustrated in step S1, an opening AP is formed at a predetermined position of an insulator sheet 3S (e.g., a position facing the lands 12 formed on the substrate 1), and the adhesive layer 31 is applied to a lower surface.

Next, by bonding the insulator sheet 3S to the first surface MS1 of the substrate 1, as illustrated in step S2, the insulator layer 3 of the insulator sheet 3S is formed on the first surface MS1 of the substrate 1.

It is noted that as illustrated in FIG. 3 in the first embodiment, the opening AP may be formed after the insulator layer 3 is formed on the substrate 1 in an alternative aspect.

Thereafter, as illustrated in step S3 of FIG. 8, a solder paste 16P is printed in the opening AP of the insulator layer 3 by, for example, a screen mask printing method or a dispenser.

Next, in step S4, the solder 16 is formed on the land 12 by reflow soldering the substrate 1. That is, the land 12 with solder is formed. Thereafter, a residual component of the solder paste is removed by washing as necessary.

Thereafter, as illustrated in step S5, a flux 22 is applied to the terminal electrodes 21 of the IC 2, and the IC 2 is mounted on the land 12 with solder.

Finally, as illustrated in step S6, the IC 2 is soldered to the land 12 by reflow soldering the substrate 1 on which the IC 2 is mounted. Thereafter, the flux component is removed by washing in an exemplary aspect. Thus, the IC module 102 is configured according to this exemplary method.

In the second embodiment, since it is not necessary to pressurize the IC 2, the height of the insulator layer 3 can be higher than the height of the IC 2.

As described above, according to the present embodiment, since the land with solder can be formed in the opening AP of the insulator layer 3, the IC 2 can be mounted in the opening AP of the insulator layer 3. Then, since the insulator layer 3 is formed around the IC 2 along the first surface MS1 of the substrate 1, the surface of the IC module 102 is flattened, and the IC 2 is protected by the insulator layer 3. Further, since it is not necessary to cover the substrate 1 with the cover lay film, the entire IC module 102 can be made thinner.

Third Exemplary Embodiment

In a third exemplary embodiment, an RFIC module for an RFID tag, and an RFID tag including the RFIC module will be described.

Figure 9A:
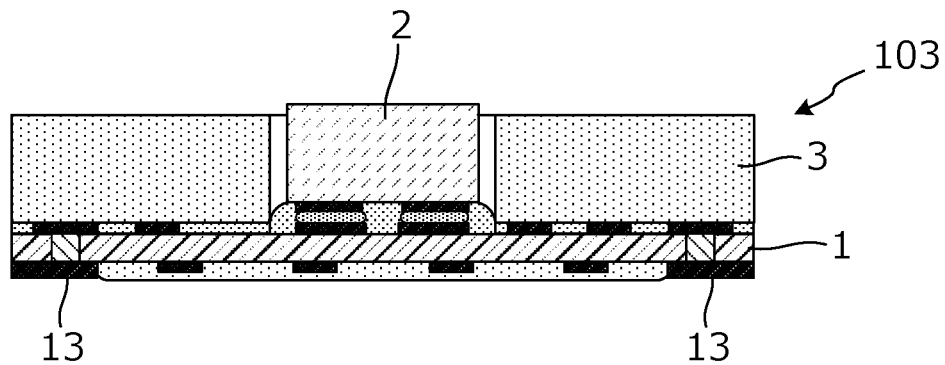
FIG. 9A is a cross-sectional view illustrating a state before an RFIC module 103 for an RFID tag is mounted on an antenna substrate 7.
Figure 9A:
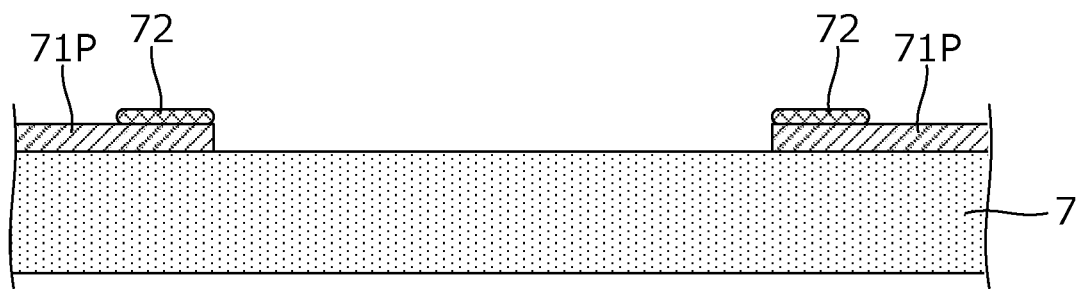
Figure 9B:
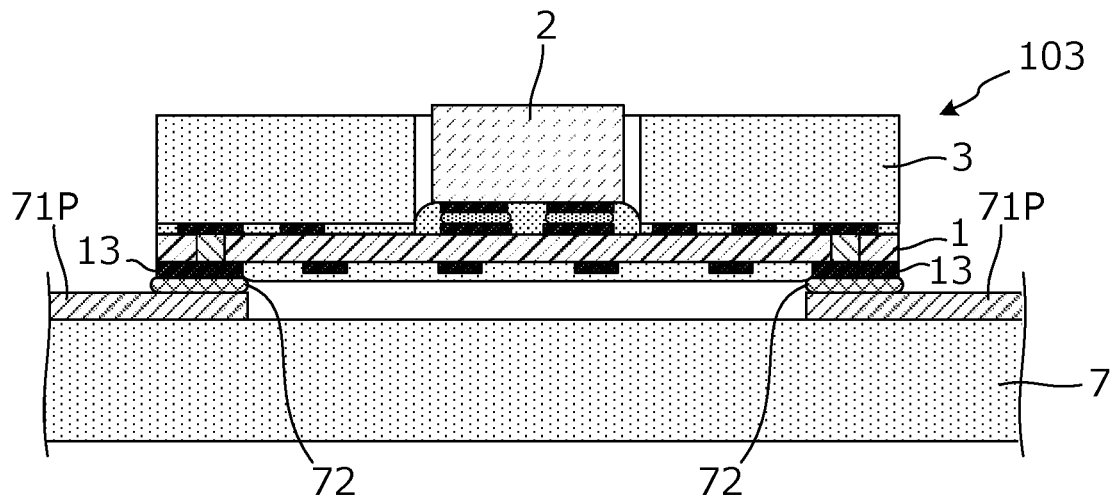
FIG. 9B is a cross-sectional view illustrating a state after the mounting.

FIG. 9A is a cross-sectional view illustrating a state before an RFIC module 103 for an RFID tag is mounted on an antenna substrate 7, and FIG. 9B is a cross-sectional view illustrating a state after the mounting.

The configuration of the RFIC module 103 is similar to that of the IC module 101 described above in the first embodiment or the IC module 102 described above in the second embodiment. Antenna conductors 71P and the like are formed on the antenna substrate 7, which is amounting destination substrate of the RFIC module 103, and the input/output terminals 13 of the RFIC module 103 are connected to the antenna conductors 71P via solders 72.

Figure 10:
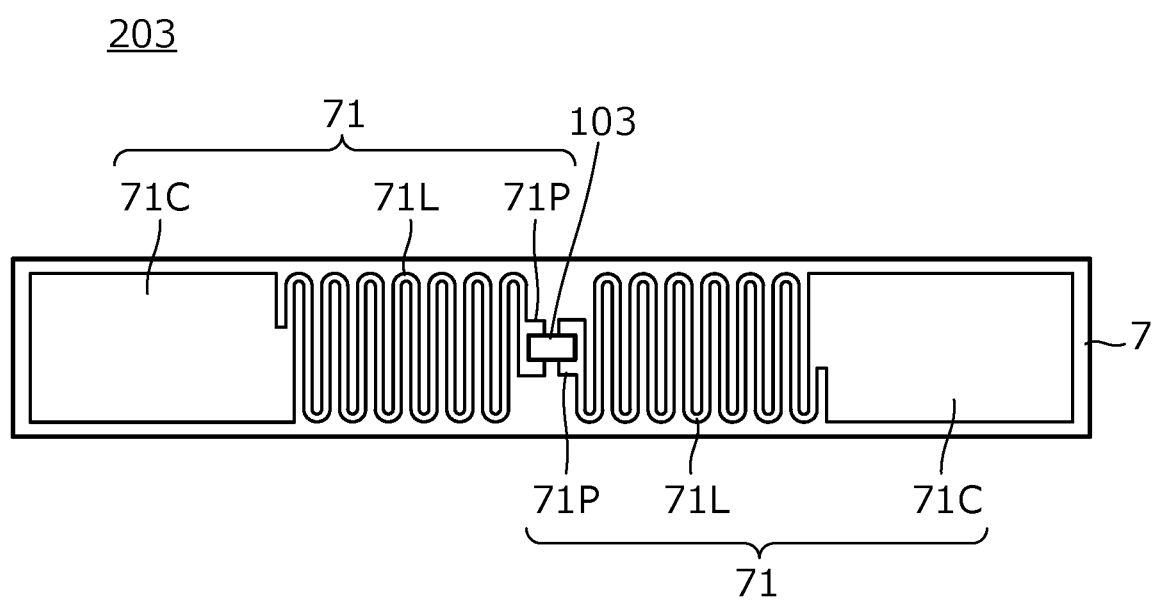
FIG. 10 is a plan view of an RFID tag 203 according to a third exemplary embodiment.

FIG. 10 is a plan view of an RFID tag 203 according to a third exemplary embodiment. Antenna conductor patterns 71 are formed on the antenna substrate 7, and the antenna conductor patterns 71 form an antenna. The antenna substrate 7 is, for example, a film of polyethylene terephthalate (PET), and each of the antenna conductor patterns 71 is, for example, a pattern of a metal foil such as copper foil.

Each of the antenna conductor patterns 71 includes antenna conductors 71P, 71L, and 71C. The antenna conductor patterns 71 constitute a dipole antenna. As illustrated in FIG. 9B, the RFIC module 103 is mounted on the antenna conductors 71P. The antenna conductor 71L has a meander line shape, and acts as a region having a high inductance component. Further, the antenna conductor 71C has a planar shape, and acts as a region having a high capacitance component.

Figure 11:
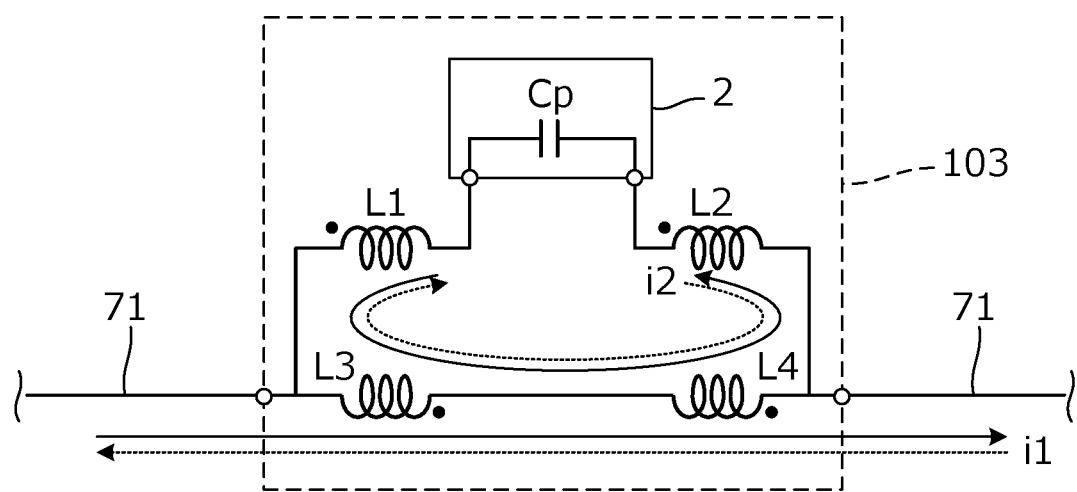
FIG. 11 is an equivalent circuit diagram of an RFIC module 103 portion in the RFID tag 203.

FIG. 11 is an equivalent circuit diagram of the RFIC module 103 portion in the RFID tag 203. The IC 2 is an RFIC for RFID, and there is an equivalent capacitance Cp between the two terminals. Inductors L1, L2, L3, and L4 form an impedance matching circuit, and two resonances are generated in a state where the impedance matching circuit and the antenna conductor patterns 71 are connected to the IC 2. The first resonance is a resonance generated in a current path including the antenna conductor patterns 71, the inductor L3, and the inductor L4, and the second resonance is a resonance generated in a current path (e.g., a current loop) including the inductors L1 to L4. The two resonances are coupled by the inductors L3 and L4 shared by the respective current paths, and two currents i1 and i2 respectively corresponding to the two resonances flow as illustrated in FIG. 11.

Figure 12:
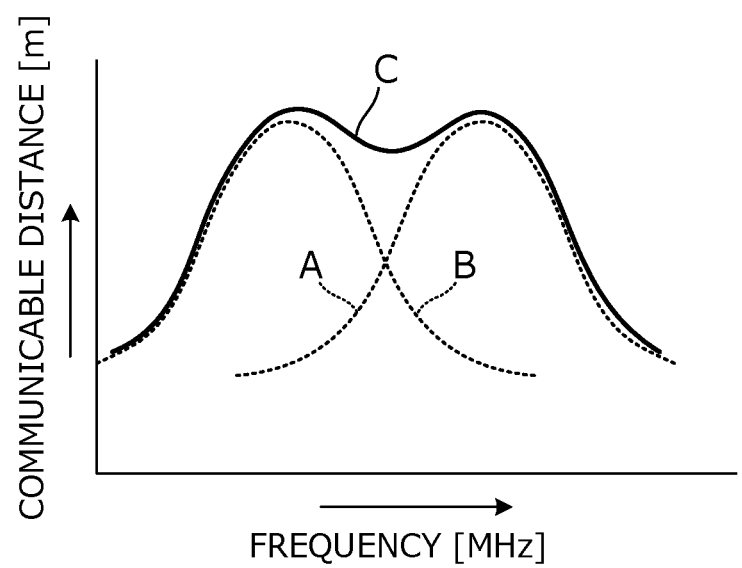
FIG. 12 is a diagram illustrating two resonance frequencies generated by an impedance matching circuit.

Both the resonance frequency of the first resonance and the resonance frequency of the second resonance are affected by the inductors L3 and L4. A difference of several tens MHz (specifically, about 5 to 50 MHz) is generated between the resonance frequency of the first resonance and the resonance frequency of the second resonance. FIG. 12 is a diagram illustrating two resonance frequencies generated by an impedance matching circuit. These resonance frequency characteristics are expressed by a curve A and a curve B in FIG. 12. By coupling the two resonances having such resonance frequencies, a broadband resonance frequency characteristic as indicated by a curve C in FIG. 12 is obtained.

Finally, it is noted that the description of the above-described embodiments is illustrative in all respects and is not restrictive. Modifications and changes can be made as appropriate by those skilled in the art.

For example, in the embodiment described above, an example in which one IC module includes a single IC 2 has been described, but the present invention can be similarly applied to an IC module including a plurality of ICs in alternative aspects.

REFERENCE SIGNS LIST

AP opening
L1, L2, L3, L4 inductor
MS1 first surface
MS2 second surface
1 substrate
2 IC
3 insulator layer
3S insulator sheet
7 antenna substrate
11 conductor pattern
12 land
13 input/output terminal
14 interlayer connection conductor
15 resist film
16 solder
16P solder paste
17 anisotropic conductor layer
17P anisotropic conductive paste
21 terminal electrode
22 flux
31 adhesive layer
71 antenna conductor pattern
71P, 71L, 71C antenna conductor
72 solder
101, 102 IC module
103 RFIC module for RFID tag
203 RFID tag

The invention claimed is:

1. An IC module comprising:
   an IC having a terminal electrode;
   a substrate having a first surface and a second surface opposing the first surface;
   a land disposed on the first surface of the substrate and connected to the terminal electrode of the IC; and
   an insulator layer that covers an area outside of an area where the land is disposed on the first surface of the substrate,
   wherein a difference between a thickness of the insulator layer and a thickness of the IC is smaller than a difference between the thickness of the insulator layer and a thickness of the substrate,
   wherein the thickness of the substrate is smaller than the thickness of the insulator layer, and
   wherein the insulator layer comprises an opening disposed therethrough that is over the area where the land is disposed on the first surface of the substrate, and the IC is disposed in the opening.

2. The IC module according to claim 1, wherein the insulator layer covers the area outside where the land is disposed on the first surface of the substrate relative to an orthogonal direction of the first surface.

3. An IC module comprising:
   an IC having a terminal electrode;
   a substrate having a first surface and a second surface opposing the first surface;
   a land disposed on the first surface of the substrate and connected to the terminal electrode of the IC; and
   an insulator layer that covers an area outside of an area where the land is disposed on the first surface of the substrate,
   wherein a difference between a thickness of the insulator layer and a thickness of the IC is smaller than a difference between the thickness of the insulator layer and a thickness of the substrate,
   wherein the thickness of the substrate is smaller than the thickness of the insulator layer, and
   wherein the thickness of the IC is larger than the thickness of the insulator layer.

4. The IC module according to claim 3, wherein the terminal electrode of the IC is connected to the land with an anisotropic conductive material that is electrically connected by pressurization and heating.

5. The IC module according to claim 1, wherein the thickness of the insulator layer is a same thickness as the thickness of the IC.

6. The IC module according to claim 1, wherein the insulator layer comprises a height that is higher than a height of the IC.

* * * * *